Jan. 9, 1968 P. C. WHITMAN ETAL 3,363,150

GLASS ENCAPSULATED DOUBLE HEAT SINK DIODE ASSEMBLY

Filed May 25, 1964

INVENTORS:
PHILIP C. WHITMAN,
WAYNE WILLIS,

BY Robert J. Mooney
THEIR ATTORNEY.

United States Patent Office 3,363,150

Patented Jan. 9, 1968

3,363,150

GLASS ENCAPSULATED DOUBLE HEAT SINK DIODE ASSEMBLY

Philip C. Whitman, Liverpool, and Wayne Willis, Elbridge, N.Y., assignors to General Electric Company, a corporation of New York Filed May 25, 1964, Ser. No. 369,688

7 Claims. (Cl. 317—234)

ABSTRACT OF THE DISCLOSURE

Multiple semiconductor rectifiers are stacked in series circuit relation between diode leads and encapsulated in a glass housing. The materials for bonding the series circuit elements together and the glass of the housing are selected so that the entire unit may be sealed together in one operation without deleterious effect on characteristics of the rectifiers or their contacts.

The present invention relates to improvements in multiple semiconductor junction diode assemblies, and more particularly to an improved low cost controlled conductance semiconductor device.

A principal object of the present invention is to provide an improved semiconductor junction signal diode assembly which has a very low manufacturing cost and is physically diminutive yet exceptionally resistant to mechanical and thermal shock.

Another object is to provide a semiconductor diode assembly of the foregoing character which is particularly suited for low cost manufacture with closely controlled conductance and low current leakage.

Another object is to provide such a semiconductor diode assembly which includes a hermetically sealed envelope of "soft," or relatively low sealing temperature, glass.

Another object is to provide a semiconductor diode assembly of the foregoing character which can readily be provided with any desired number of diodes so as to have any desired corresponding voltage-current characteristic.

Another object is to provide a semiconductor diode assembly of the foregoing character of which all the parts may be assembled by a single heating operation which can be conducted in air and which simultaneously hermetically seals the glass envelope.

These and other objects of the present invention will be apparent from the following description together with the accompanying drawing in which.

Figure 1:
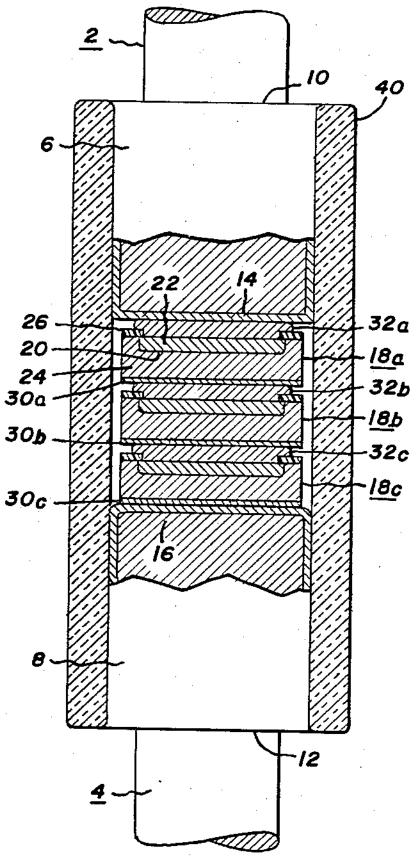
FIGURE 1 is a fragmentary view, partially broken away in axial section, of a semiconductor signal diode assembly constructed in accordance with the present invention.

Referring to FIGURE 1 of the drawing, a semiconductor signal diode assembly constructed in accordance with our invention includes two identical substantially coaxially arranged oppositely extending electrodes or leads 2, 4 of a metallic composition having a low electrical resistivity and having sealing portions 6, 8 capable of being easily hermetically sealed to a "soft" glass, i.e. a glass such as Corning 0120 or Kimble KG12 having a working point of less than about 1000° C., and a softening point of less than about 750° C. A preferred material for leads 2 and 4 is a copper-covered nickel-iron core material known commercially as "Dumet." The sealing portions 6, 8 are of equal and somewhat enlarged diameter relative to the remainder of the leads, and form axially facing shoulders 10, 12. To enhance electrical and mechanical contact thereto, the sealing portion 6 includes on its end face at least partial covering of a metallic contact layer 14, preferably of copper, and the end face of sealing portion 8 is likewise at least partially covered with a similar contact layer 16. The contact layers 14, 16 are plated or otherwise adhered to the end faces of the leads so as to make a good minimum electrical resistance contact with the remaining portions of the leads.

Surrounding the sealing portions 6, 8 of the leads and enclosing the space between them is a cylinder 40 of glass which is hermetically sealed to the cylindrical surfaces of portions 6, 8 to complete the envelope of the diode assembly. The cylinder 40 is preferably of a "soft" glass, having, for example, a working point of less than about 1000° C., and a softening point of less than about 750° C., such as Corning 0120 glass or Kimble KG12 glass.

Between the confronting contact layers 14, 16 is situated a plurality of wafer-like semiconductor pellets **18*a*, 18*b*, 18*c* of semiconductor material such as monocrystalline silicon or the like, each of which contains an internal rectifying PN junction 20 between a P region 22 and an N region 24. The junction 20 of each pellet is covered at one major face of the pellet by an electrically insulative junction protecting and passivating layer 26 centrally apertured to expose substantially all of region 22. The pellet 18*c* is mounted on the end face of lead 4 by means of a solder layer 30*c* which is preferably previously bonded to the major face of pellet 18*c* remote from its protective layer 26 and makes a eutectiferous bond with copper layer 16. The solder 30*c* preferably consists predominantly of a metal, such as silver, whose eutectic temperature with contact layer 16 is less, and preferably about 100° C. less, than the sealing temperature of glass 40. Solder layer 30*c* can contain a small amount, such as 0.1% to 1%, of a donor impurity such as antimony, if desired, to preclude the formation of a rectifying contact between the pellet 18*c* and the lead 4 to which it is attached. Solder 30*c* also contains a significant portion of gold, for example 20 to 40% by weight, preferably provided at least in part as by evaporating or plating of a gold undercoat, best shown at 34*c* in FIGURE 2, onto pellet 18*c* as a foundation portion of layer 30*c*. Application of gold undercoat 34*c* enhances the adherence of layer 30*c* to the pellet and the gold also serves to lower the melting or solidus point of the resulting silver-silicon-gold alloy to less than the sealing temperature of the glass 40**.

Figure 2:
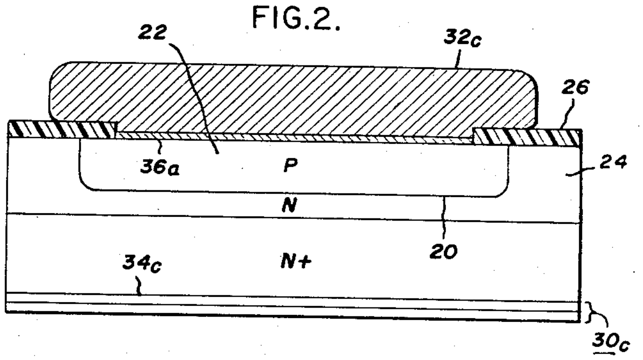
FIGURE 2 is a more detailed view, to an enlarged scale, of a portion of the structure of FIGURE 1.

The P region 22 of the pellet **18*a* is mechanically and electrically connected to the end of lead 2 by a metallic boss or cushion 32*a* of a composition whose coefficient of expansion is such that the aggregate thermal coefficient of expansion of the series structure formed by the pellet 18*a* and cushion 32*a* approximates, within 50 to 150%, the thermal coefficient of expansion of glass cylinder 40 within a desired temperature range such as −60° C. to 200° C. Cushion 32*a* also has a eutectic temperature with contact 14 less than the glass 40 sealing temperature, and a melting or solidus point temperature with pellet 18*a* such that no, or only an insignificant, amount of melting at the cushion-to-pellet interface occurs during sealing of the glass envelope. The material of cushion 32*a* is preferably predominantly silver. The cushion 32*a*** is preferably secured to the pellet 18*a* prior to assembly of the pellet to the leads, for example by being plated on and alloyed therein in accordance with plating and alloying procedures known to those skilled in the art. A thin layer of gold 36*a*, as best shown in FIGURE 2, may be applied to pellet 18*a* beneath cushion 32*a* to enhance the attachment of cushion 32*a* to the pellet.

The confronting major faces of adjacent pellets 18*a* and 18*b* are likewise mechanically and electrically connected with an ohmic or non-rectifying contact by a layer of solder 30*a*, similar to solder 30*c*, applied to the bottom face of pellet 18*a*, and fused or intermetallically bonded to a cushion 32*b*, similiar to cushion 32*a*, applied to the top face of pellet 18*b*, the fusing temperature of solder 30*a* and cushion 32*b* being less than the glass 40 sealing temperature. Likewise, pellets 18*b* and 18*c* are mechanically and electrically connected with an ohmic or non-rectifying contact by solder layer 30*b*, similar to solder 30*c*, and cushion 32*c* similar to cushion 32*a*.

The pellets 18*a*, 18*b*, 18*c* are preferably so dimensioned that the maximum dimension across their major face is slightly smaller than the inside diameter of the glass cylinder 40, for easy entrance of the pellets into cylinder 40. The diameter of leads 2, 4 may be, for example, 20 mils, the enlarged diameter sealing portions 6, 8 may each have a diameter of, for example, 32 mils and a length of 70 mils, and the internal diameter of the glass cylinder 40 prior to sealing may be, for example, 34 mils.

The structure above described lends itself particularly to an assembly sequence which is extremely simple and hence can be accomplished very economically. The lead 4 can be vertically supported on shoulder 12 by a suitable fixture with its sealing portion 8 inserted up into one end of the glass cylinder 40, and the pellets 18*a*, 18*b*, 18*c*, with their respective solder layers 30*a*, 30*b*, 30*c* and their respective cushions 32*a*, 32*b*, 32*c* pre-attached, may be then simply dropped in the upper open end of the glass cylinder 40. Thereafter, the second lead 2 may be coaxially inserted into the upper end of the glass cylinder into contact with the cushion 32*a*. The entire assembly may then be suitably heated for a brief period such as 25 seconds at about 800° C. to cause the solder layer 30*c* to fuse with and attach to end face 16 of lead 4, fuse and attach cushion 32*a* to the end face 14 of lead 2, fuse and attach cushion 32*c* to solder layer 30*b*, fuse and attach cushion 32*b* to solder layer 30*a*, and cause the end portions of the glass cylinder 40 to soften and fuse into hermetic sealing contact with the sealing portions 6, 8 of the leads.

The resistance to oxide formation of the silver in solder 30*a*, 30*b*, 30*c* and cushions 32*a*, 32*b*, 32*c* at such a sealing temperature particularly facilitates reliable assembly in the above-described fashion. Any permanently deleterious effect on the pellets during the heating cycle is avoided by the short heating time required for complete assembly, and the relatively low temperatures sufficient to seal the soft glass and attach the solder layers 30*a*, 30*b*, 30*c* and cushions 32*a*, 32*b*, 32*c*.

During the heat sealing of the diode assembly, a slight amount of axial pressure may, if desired, by supplied to compress the pellets 18*a*, 18*b*, 18*c*, solder layers 30*a*, 30*b*, 30*c* and cushions 32*a*, 32*b*, 32*c* between the opposing faces of the leads. This facilitates making good fused metal contacts between adjacent pellets, between cushion 32*a* and layer 14 and between the layer 30*c* and layer 16, without requiring a non-oxidizing atmosphere. For a contact region between the cushion 32 and a silicon pellet of, for example, a 14 mil x 14 mil square, an axial pressure of about 100 to 200 grams is found to be quite sufficient to insure good soldering in an air atmosphere, and the air atmosphere enhances sealing of the glass to lead portions 6, 8.

Figure 3:
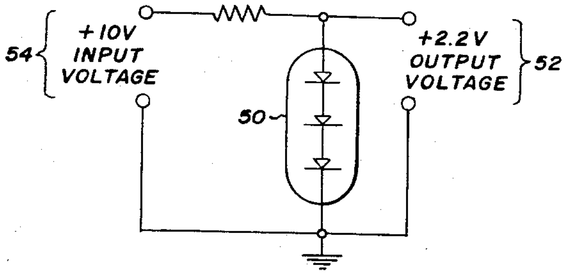
FIGURE 3 is a schematic diagram exemplifying one form of circuit with which the diode assembly of the present invention is useful.

FIGURE 3 is an example of a simple voltage regulator circuit employing a diode assembly 50 constructed according to the present invention and useful for supplying with three diodes a regulated voltage output of 2.2 volts at terminals 52, from an unregulated input at terminals 54. The assembly 50 contains, as shown schematically, three pellets, such as pellets 18, but may as desired be provided with more or fewer pellets so as to provide the desired voltage magnitude at terminals 52.

Figure 4:
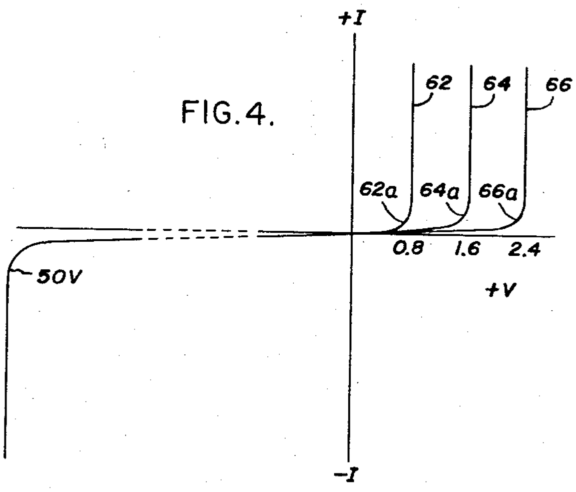
FIGURE 4 is a graph showing certain electrical characteristics of one form of device constructed according to the present invention.

FIGURE 4 shows the voltage-current characteristics of a diode assembly constructed according to the present invention. Curve 62 shows the forward-bias current flow or conduction characteristic through one diode of the assembly, curve 64 showing the conduction characteristic for an assemblage of two diodes, and curve 66 that for an assemblage of three diodes. It will be evident that the forward voltage drops across the various diode combinations remain substantially constant over a wide current range, and this fact together with the relatively sharp "knees" 62, 64*a*, 66*a*, in curves 62, 64, 66 enhances the suitability of such diode assemblies for voltage regulation use, particularly at low voltages in the range below six volts where, for silicon, zener breakdown characteristics have undesirably soft "knees."

Figure 5:
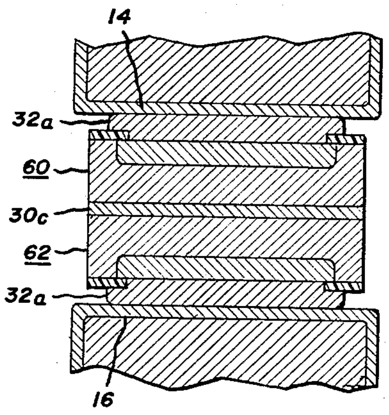
FIGURE 5 is an alternative form of diode assembly according to the present invention.

FIGURE 5 shows an alternative form of assembly of two diodes, arranged back-to-back. Diode 60 has a contact 32*a* fused to a confronting end face portion 14 of an external lead, and diode 62 is similarly connected to face 16 of another external lead. The back faces of the two diodes are connected with a non-rectifying electrical and mechanical connection by the fusing of their respective solder layers 30*c*.

The diode assembly construction above described has many advantages. Use of the relatively thick solder cushion 32*a* eliminates the need for the serpentine resilient connector heretofore frequently required to accommodate thermal expansion coefficient differences in semiconductor devices having glass envelopes. Each pellet 18*a*, 18*b*, 18*c* is dimensioned to have the maximum dimension of its major faces smaller than the inside diameter of the cylinder 40, and hence each pellet can be simply dropped inside cylinder 40 and will land on the upfacing end of the lead therein, or the previously inserted pellet as the case may be, automatically properly arranged and oriented for permanent attachment onto such end face. None of the pellets requires support from or contact with glass cylinder 40 but all are supported exclusively by the axially facing surfaces.

Another advantage of the structure shown is that the direct connection of the end pellets 18*a*, 18*c* to the leads by the solder regions 32*a* and 30*c*, and the direct intermediate connections of layers 30*a* to 32*b* and 30*b* to 32*c*, and the relatively large transverse dimensions of all of these fused metal connections, insures a good thermal conductivity path from the pellets to the leads and thus makes it possible for the leads themselves to serve as excellent heat sinks for any heat generated in the pellets during electrical operation of the diode assembly. The relatively thick cushions 32*a*, 32*b*, 32*c* also provide a sufficient axial spacing between adjacent pellets and between the end pellet and the confronting face of the lead 2 to avoid short circuits by inadvertent contact of pellet edges or piercing of protective layers 26. Finally, the reduced interior volume of the diode assembly construction herein described gives it an inherently better resistance to crushing forces and hence makes it particularly suitable for eventual potting in an encapsulant with other circuit elements.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters Patent of the United States is:

1. A semiconductor junction diode assembly comprising a pair of electrodes having spaced opposed faces, an annular member of glass having a working point of less than 1000° C. enclosing and sealed to portions of said electrodes to form an envelope therewith enclosing the space between said opposed faces, a stack of wafer-like pellets of semiconductor material disposed between said opposed faces, each of said pellets having a first conductivity type region extending to one major face and a second conductivity type region extending to the opposite major face, intermetallic bonds between each of said opposed faces and the adjacent pellet and between adjacent pellets, all of said intermetallic bonds having a melting temperature less than the sealing temperature of said glass.

2. A semiconductor junction diode assembly comprising a pair of electrodes having spaced opposed faces, an annular member of glass enclosing and sealed to portions of said electrodes to form an envelope therewith enclosing the space between said opposed faces, a metallic contact layer including copper on each of said opposed faces, a stack of wafer-like pellets of semiconductor material disposed between said contact layers, each of said pellets having a first conductivity type region extending to one major face and a second conductivity type region extending to the opposite major face, each of said pellets having an electrically conductive boss including silver outstanding from one major face and a layer of metal solder on its other major face, the pellet adjacent one of said contact layers being connected thereto by an intermetallic bond of its conductive boss with said one contact layer, the pellet adjacent the other of said contact layers being connected thereto by an intermetallic bond of its solder layer with said other contact layer, and the confronting major faces of adjacent pellets being connected by an intermetallic bond between the conductive cushion of one of said adjacent pellets and the solder layer of the other of said adjacent pellets, all of said intermetallic bonds having a melting temperature less than the sealing temperature of said glass.

3. A semiconductor junction diode assembly comprising a pair of electrodes having spaced opposed faces, an annular member of glass enclosing and sealed to portions of said electrodes to form an envelope therewith enclosing the space between said opposed faces, a metallic contact layer on each of said opposed faces, a stack of wafer-like pellets of semiconductor material disposed between said opposed faces, each of said pellets having a first conductivity type region extending to one major face and a second conductivity type region extending to the opposite major face, first intermetallic bonds between each of said opposed faces and the adjacent pellet, said first intermetallic bonds having melting temperatures less than the sealing temperature of said glass, metallic bonding layers on each of the confronting faces of adjacent pellets, said bonding layers having a eutectic temperature with the pellets not less than the sealing temperature of said glass and having a eutectic temperature with each other less than the sealing temperature of said glass.

4. Apparatus as defined in claim 3 wherein the working point of said glass is less than 1000° C.

5. Apparatus as defined in claim 3 wherein said pellets are silicon and the material of said metallic bonding layers includes silver and gold.

6. A semiconductor junction diode assembly comprising a pair of electrodes having spaced opposed faces, an annular member of glass having a working point of less than 1000° C. enclosing and sealed to portions of said electrodes to form an envelope therewith enclosing the space between said opposed faces, a metallic contact layer of copper on each of said opposed faces, a stack of wafer-like pellets of silicon semiconductor material disposed between said contact layers, each of said pellets having a first conductivity type region extending to one major face and a second conductivity type region extending to the opposite major face, each of said pellets having a relatively thick electrically conductive cushion of predominantly silver outstanding from one major face and a layer of metal solder including silver and gold on its other major face, the pellet adjacent one of said contact layers being connected thereto by a first intermetallic bond of its conductive cushion with said one contact layer, the pellet adjacent the other of said contact layers being connected thereto by a second intermetallic bond of its solder layer with said other contact layer, and the confronting major faces of each set of adjacent pellets being connected by a third intermetallic bond between the conductive cushion of one of said adjacent pellets and the solder layer of the other of said adjacent pellets, the sealing temperature of said glass being less than the eutectic temperature of each cushion with its respective pellet and being greater than the melting temperature of said intermetallic bonds.

7. A semiconductor junction diode assembly comprising a pair of electrodes having spaced opposed faces, an annular insulating member enclosing and sealed to portions of said electrodes to form an envelope therewith enclosing the space between said opposed faces, a stack of wafer-like pellets of semiconductor material disposed between said opposed faces, each of said pellets having a first conductivity type region extending to one major face and a second conductivity type region extending to the opposite major face, intermetallic bonds between each of said opposed faces and the adjacent pellet and between adjacent pellets, all of said intermetallic bonds having a melting temperature less than the temperature of sealing said insulating member to said electrodes.

References Cited

UNITED STATES PATENTS

| | | | |
|---|---|---|---|
| 2,694,168 | 11/1954 | North et al. | 317—234 |
| 2,763,822 | 9/1956 | Frola et al. | 317—234 |
| 2,982,892 | 5/1961 | Bender et al. | 317—234 |
| 3,189,799 | 6/1965 | Moroney | 317—234 |
| 3,193,366 | 7/1965 | Clark | 317—234 X |
| 3,212,160 | 10/1965 | Dale et al. | 317—235 X |
| 3,261,075 | 7/1966 | Carman | 317—235 X |
| 3,265,805 | 8/1966 | Carlan et al. | 317—234 X |
| 3,266,137 | 8/1966 | DeMille et al. | 317—234 X |
| 3,274,454 | 9/1966 | Haberecht | 317—234 |

JOHN W. HUCKERT, *Primary Examiner.*

A. M. LESNIAK, *Assistant Examiner.*